US008493081B2

(12) United States Patent
Bolbocianu et al.

(10) Patent No.: US 8,493,081 B2
(45) Date of Patent: Jul. 23, 2013

(54) WIDE ACTIVATION ANGLE PINCH SENSOR SECTION AND SENSOR HOOK-ON ATTACHMENT PRINCIPLE

(75) Inventors: Liviu Bolbocianu, North York (CA); Rade Isailovic, North York (CA)

(73) Assignee: Magna Closures Inc., Newmarket (CA)

( * ) Notice: Subject to any disclaimer, the term of this patent is extended or adjusted under 35 U.S.C. 154(b) by 408 days.

(21) Appl. No.: 12/963,359

(22) Filed: Dec. 8, 2010

(65) Prior Publication Data

US 2011/0169513 A1 Jul. 14, 2011

Related U.S. Application Data

(60) Provisional application No. 61/267,574, filed on Dec. 8, 2009.

(51) Int. Cl.
*G01R 27/08* (2006.01)
*G01L 1/00* (2006.01)
*G01L 5/04* (2006.01)

(52) U.S. Cl.
USPC .................. 324/691; 73/862.391; 73/862.381

(58) Field of Classification Search
USPC ............. 324/705, 691, 649, 600; 73/862.381, 73/862.391, 862.68, 862.621, 862.471, 862.46, 73/849
See application file for complete search history.

(56) References Cited

U.S. PATENT DOCUMENTS

| | | | |
|---|---|---|---|
| 3,652,911 | A | 3/1972 | Gorissen |
| 3,724,526 | A | 4/1973 | Huprich |
| 3,727,348 | A | 4/1973 | Steinmann et al. |
| 3,762,099 | A | 10/1973 | Chaisson |
| 3,797,171 | A | 3/1974 | Farmer |
| 3,919,809 | A | 11/1975 | Haughton |
| 3,936,977 | A | 2/1976 | Runft et al. |
| 4,045,631 | A | 8/1977 | Dann |
| 4,157,845 | A | 6/1979 | Queveau |
| 4,171,410 | A | 10/1979 | Frob |
| 4,351,016 | A | 9/1982 | Felbinger |
| 4,443,972 | A | 4/1984 | Dolhaine |
| 4,453,112 | A | 6/1984 | Sauer et al. |
| 4,506,378 | A | 3/1985 | Noso et al. |
| 4,557,072 | A | 12/1985 | Rittmeister et al. |
| 4,625,456 | A | 12/1986 | Lafontaine |
| 4,683,975 | A | 8/1987 | Booth et al. |
| 4,746,845 | A | 5/1988 | Mizuta et al. |

(Continued)

FOREIGN PATENT DOCUMENTS

| | | | |
|---|---|---|---|
| DE | 1460111 | A1 | 12/1968 |
| DE | 1660717 | A1 | 3/1971 |

(Continued)

*Primary Examiner* — Hoai-An D Nguyen
(74) *Attorney, Agent, or Firm* — Millman IP Inc.

(57) ABSTRACT

A resistive pinch sensor utilizing electrically conductive wires encapsulated in a resiliently deformable casing. A pinch is detected when one of the wires, which is normally separated by an air gap within the casing, contacts another wire lowering the electrical resistance therebetween. The described pinch sensors have wide activation ranges or angles. Tri-lobed designs provide wide activation range by incorporating at least three electrically-conductive conduits that are substantially equidistantly spaced circumferentially along the inner wall of a tubular casing. One of the conduits, or optionally an axially arranged electrically-conductive core may function as the reference element. Coaxial designs provide wide activation range by incorporating a central electrically-conductive core and a coaxial electrically-conductive tubular outer sheath that are normally spaced apart by at least one non-conductive spacer.

16 Claims, 4 Drawing Sheets

U.S. PATENT DOCUMENTS

| | | | | |
|---|---|---|---|---|
| 4,773,155 | A | 9/1988 | Buchien | |
| 4,783,048 | A | 11/1988 | St. Clair | |
| 4,843,761 | A | 7/1989 | Sandling | |
| 4,920,698 | A | 5/1990 | Friese et al. | |
| 4,998,577 | A | 3/1991 | Kobayashi et al. | |
| 5,056,847 | A | 10/1991 | Stillwell et al. | |
| 5,072,080 | A | 12/1991 | Beckhausen | |
| 5,072,544 | A | 12/1991 | Breck, Jr. | |
| 5,105,131 | A | 4/1992 | Schap | |
| 5,129,192 | A | 7/1992 | Hannush | |
| 5,158,340 | A | 10/1992 | Boda | |
| 5,167,432 | A | 12/1992 | Buttner et al. | |
| 5,299,386 | A | 4/1994 | Naegelli et al. | |
| 5,333,411 | A | 8/1994 | Tschirschwitz et al. | |
| 5,459,962 | A | 10/1995 | Bonne et al. | |
| 5,512,716 | A | 4/1996 | Buchien | |
| 5,515,649 | A | 5/1996 | Strab | |
| 5,530,329 | A | 6/1996 | Shigematsu et al. | |
| 5,575,372 | A | 11/1996 | Huebner et al. | |
| 5,594,316 | A | 1/1997 | Hayashida | |
| 5,605,429 | A | 2/1997 | Hejazi et al. | |
| 5,610,484 | A | 3/1997 | Georgin | |
| 5,644,869 | A | 7/1997 | Buchanan, Jr. | |
| 5,653,144 | A | 8/1997 | Fenelon | |
| 5,661,385 | A | 8/1997 | McEwan | |
| 5,689,160 | A | 11/1997 | Shigematsu et al. | |
| 5,689,250 | A | 11/1997 | Kremser | |
| 5,693,993 | A | 12/1997 | Ito et al. | |
| 5,711,111 | A | 1/1998 | Nyffenegger et al. | |
| 5,728,983 | A | 3/1998 | Ishihara et al. | |
| 5,787,636 | A | 8/1998 | Buchanan, Jr. | |
| 5,801,340 | A | 9/1998 | Peter | |
| 5,801,501 | A | 9/1998 | Redelberger | |
| 5,816,309 | A | 10/1998 | Paradise | |
| 5,857,510 | A | 1/1999 | Krupke et al. | |
| 5,880,421 | A | 3/1999 | Tsuge et al. | |
| 5,920,521 | A | 7/1999 | Kromer et al. | |
| 5,929,406 | A | 7/1999 | Thiel | |
| 5,932,931 | A | 8/1999 | Tanaka et al. | |
| 5,949,207 | A | 9/1999 | Luebke et al. | |
| 5,955,854 | A | 9/1999 | Zhang et al. | |
| 5,982,126 | A | 11/1999 | Hellinga et al. | |
| 6,032,415 | A | 3/2000 | Tajima | |
| 6,034,495 | A | 3/2000 | Tamagawa et al. | |
| 6,034,497 | A | 3/2000 | Tamagawa et al. | |
| 6,037,727 | A | 3/2000 | Kawanobe et al. | |
| 6,051,901 | A | 4/2000 | Ishida | |
| 6,051,945 | A | 4/2000 | Furukawa | |
| 6,082,499 | A | 7/2000 | O'Donnell | |
| 6,088,965 | A | 7/2000 | Fukumoto et al. | |
| 6,097,299 | A | 8/2000 | Yamamura | |
| 6,107,712 | A | 8/2000 | Yamamura et al. | |
| 6,114,820 | A | 9/2000 | Nishigaya | |
| 6,125,583 | A | 10/2000 | Murray et al. | |
| 6,134,836 | A | 10/2000 | Kawanobe et al. | |
| 6,134,837 | A | 10/2000 | Kawanobe et al. | |
| 6,141,908 | A | 11/2000 | Bowen | |
| 6,145,918 | A | 11/2000 | Wilbanks, II | |
| 6,150,781 | A | 11/2000 | Hollerbach | |
| 6,160,370 | A | 12/2000 | Ohnuma | |
| 6,163,080 | A | 12/2000 | Castellon | |
| 6,164,015 | A | 12/2000 | Kawanobe et al. | |
| 6,169,346 | B1 | 1/2001 | Nakamura et al. | |
| 6,169,379 | B1 | 1/2001 | Zhang et al. | |
| 6,183,040 | B1 | 2/2001 | Imaizumi et al. | |
| 6,189,265 | B1 | 2/2001 | Fink | |
| 6,194,855 | B1 | 2/2001 | Lochmahr et al. | |
| 6,199,322 | B1 | 3/2001 | Itami et al. | |
| 6,199,943 | B1 | 3/2001 | Lamm et al. | |
| 6,209,264 | B1 | 4/2001 | D'Abreu | |
| 6,220,026 | B1 | 4/2001 | Ritter | |
| 6,223,468 | B1 | 5/2001 | Kobayashi | |
| 6,226,925 | B1 | 5/2001 | Shimura et al. | |
| 6,233,872 | B1 | 5/2001 | Glagow et al. | |
| 6,271,512 | B1 | 8/2001 | Lewis | |
| 6,274,947 | B1 | 8/2001 | Terashima | |
| 6,283,543 | B1 | 9/2001 | Hahn et al. | |
| 6,290,283 | B1 | 9/2001 | Fukumoto et al. | |

| | | | | |
|---|---|---|---|---|
| 6,291,957 | B1 | 9/2001 | Hopson et al. | |
| 6,297,605 | B1 | 10/2001 | Butler et al. | |
| 6,297,609 | B1 | 10/2001 | Takahashi et al. | |
| 6,304,178 | B1 | 10/2001 | Hayashida | |
| 6,340,199 | B1 | 1/2002 | Fukumoto et al. | |
| 6,341,448 | B1 | 1/2002 | Murray et al. | |
| 6,366,042 | B1 | 4/2002 | Gerbetz | |
| 6,377,009 | B1 | 4/2002 | Philipp | |
| 6,382,701 | B1 | 5/2002 | Langguth et al. | |
| 6,386,620 | B1 | 5/2002 | Fukumoto et al. | |
| 6,404,084 | B1 | 6/2002 | Niki et al. | |
| 6,405,485 | B1 | 6/2002 | Itami et al. | |
| 6,425,206 | B1 | 7/2002 | Noda et al. | |
| 6,426,604 | B1 | 7/2002 | Ito et al. | |
| 6,430,872 | B1 | 8/2002 | Fin | |
| 6,456,916 | B1 | 9/2002 | Edgar et al. | |
| 6,472,835 | B2 | 10/2002 | Ogasawara | |
| 6,472,984 | B1 | 10/2002 | Risi | |
| 6,483,054 | B2 | 11/2002 | Suzuki et al. | |
| 6,502,352 | B1 | 1/2003 | Bonduel | |
| 6,504,332 | B1 | 1/2003 | Lamm | |
| 6,531,840 | B2 | 3/2003 | Sugawara | |
| 6,534,939 | B2 | 3/2003 | Kato et al. | |
| 6,550,597 | B2 | 4/2003 | Taniguchi | |
| 6,552,506 | B2 | 4/2003 | Kramer et al. | |
| 6,555,978 | B1 | 4/2003 | Castellon | |
| 6,573,676 | B1 | 6/2003 | Klesing | |
| 6,573,677 | B2 | 6/2003 | Gerbetz | |
| 6,573,678 | B2 | 6/2003 | Losey et al. | |
| 6,575,864 | B1 | 6/2003 | Dean | |
| 6,580,240 | B2 | 6/2003 | Buchheit et al. | |
| 6,580,241 | B1 | 6/2003 | Sugawara | |
| 6,588,151 | B1 | 7/2003 | Gosicki et al. | |
| 6,592,178 | B2 | 7/2003 | Schober et al. | |
| 6,600,284 | B1 | 7/2003 | Weber et al. | |
| 6,605,910 | B2 | 8/2003 | Mullet et al. | |
| 6,609,432 | B2 * | 8/2003 | Kume | 73/862.391 |
| 6,630,808 | B1 | 10/2003 | Kliffken et al. | |
| 6,633,147 | B2 | 10/2003 | Gerbetz | |
| 6,633,148 | B1 | 10/2003 | Klesing | |
| 6,660,200 | B2 | 12/2003 | Nakajo | |
| 6,660,955 | B1 | 12/2003 | Bues | |
| 6,667,591 | B2 | 12/2003 | Mullet et al. | |
| 6,670,654 | B2 | 12/2003 | Lanzerotti et al. | |
| 6,672,362 | B1 | 1/2004 | Mullet et al. | |
| 6,678,601 | B2 | 1/2004 | Whinnery | |
| 6,689,970 | B2 | 2/2004 | Burgess et al. | |
| 6,690,096 | B2 | 2/2004 | Sasaki | |
| 6,701,779 | B2 | 3/2004 | Volant et al. | |
| 6,703,933 | B2 | 3/2004 | Sicuranza | |
| 6,706,978 | B2 | 3/2004 | Wagatsuma et al. | |
| 6,717,081 | B2 | 4/2004 | Miyake | |
| 6,719,356 | B2 | 4/2004 | Cleland et al. | |
| 6,724,324 | B1 | 4/2004 | Lambert | |
| 6,729,071 | B1 | 5/2004 | Kawanobe et al. | |
| 6,731,483 | B2 | 5/2004 | Mason, Jr. et al. | |
| 6,740,826 | B1 | 5/2004 | Friedrich et al. | |
| 6,744,365 | B2 | 6/2004 | Sicuranza | |
| 6,747,233 | B1 | 6/2004 | Glinkowski | |
| 6,748,308 | B2 | 6/2004 | Losey | |
| 6,752,330 | B2 | 6/2004 | DiMaggio et al. | |
| 6,753,669 | B2 | 6/2004 | Spreng et al. | |
| 6,756,754 | B2 | 6/2004 | Bent et al. | |
| 6,759,614 | B2 | 7/2004 | Yoneyama | |
| 6,769,358 | B2 | 8/2004 | Jordan | |
| 6,769,938 | B2 | 8/2004 | Eckert et al. | |
| 6,771,159 | B2 | 8/2004 | Ramahi et al. | |
| 6,772,559 | B1 | 8/2004 | Bouamra et al. | |
| 6,788,016 | B2 | 9/2004 | Whinnery | |
| 6,794,771 | B2 | 9/2004 | Orloff | |
| 6,794,837 | B1 | 9/2004 | Whinnery et al. | |
| 6,798,029 | B2 | 9/2004 | Volant et al. | |
| 6,802,154 | B1 | 10/2004 | Holt et al. | |
| 6,809,440 | B2 | 10/2004 | Peterreins | |
| 6,809,488 | B2 | 10/2004 | Otte | |
| 6,812,466 | B2 | 11/2004 | O'Connor et al. | |
| 6,822,410 | B2 | 11/2004 | Whinnery et al. | |
| 6,830,173 | B2 | 12/2004 | Barber et al. | |
| 6,831,380 | B2 | 12/2004 | Rybnicek et al. | |

6,833,713 B2 12/2004 Schoepf et al.
6,836,209 B2 12/2004 Ploucha
6,842,098 B2 1/2005 Van Zeeland
6,846,999 B2 1/2005 Kawakami et al.
6,850,145 B1 2/2005 Kremers et al.
6,855,902 B2 2/2005 Lee et al.
6,856,112 B2 2/2005 Ohshima
6,859,030 B2 2/2005 Otte
6,867,563 B2 3/2005 Ohshima
6,873,127 B2 3/2005 Murray
6,883,382 B2 4/2005 Ogino et al.
6,889,578 B2 5/2005 Spaziani et al.
6,896,268 B2 5/2005 Hofmann et al.
6,898,295 B2 5/2005 Inamura et al.
6,903,288 B2 6/2005 Varga
6,906,514 B2 6/2005 Ausserlechner
6,906,527 B1 6/2005 Niimi et al.
6,917,002 B2 7/2005 Burgess et al.
6,922,006 B2 7/2005 Nomerange
6,924,538 B2 8/2005 Jaiprakash et al.
6,924,614 B2 8/2005 Onozawa et al.
6,930,577 B2 8/2005 Subramanian et al.
6,936,984 B2 8/2005 Wilson
6,936,986 B2 8/2005 Nuber
6,936,988 B2 8/2005 Nakazawa et al.
6,940,028 B2 9/2005 Eggers
6,940,246 B2 9/2005 Mochizuki et al.
6,943,310 B2 9/2005 Eisenhower
6,946,608 B2 9/2005 Brede et al.
6,952,087 B2 10/2005 Lamm
6,955,206 B2 10/2005 Mullet et al.
6,962,228 B2 11/2005 Ogino et al.
6,963,029 B1 11/2005 Rivers et al.
6,963,267 B2 11/2005 Murray
6,964,132 B2 11/2005 Otomo et al.
6,966,149 B2 11/2005 Fenelon
6,967,451 B2 11/2005 Miyauchi
6,968,746 B2 11/2005 Shank et al.
6,972,536 B2 12/2005 Mukai et al.
6,975,047 B2 12/2005 Pippin
6,990,009 B2 1/2006 Bertin et al.
7,000,352 B2 2/2006 Ishihara et al.
7,009,153 B2 3/2006 Tomatsu
7,009,352 B2 3/2006 Yamamoto et al.
7,012,491 B1 3/2006 Geisberger et al.
7,015,409 B2 3/2006 Duffek et al.
7,015,666 B2 3/2006 Staus
7,021,001 B1 4/2006 Schooler et al.
7,023,307 B2 4/2006 Dooley
7,026,930 B2 4/2006 Appel et al.
7,038,154 B2 5/2006 Hofte et al.
7,038,414 B2 5/2006 Daniels et al.
7,038,896 B2 5/2006 Sullivan et al.
7,044,271 B2 5/2006 De Coi
7,046,129 B2 5/2006 Regnet et al.
7,049,535 B2 5/2006 Matsuyama et al.
7,050,897 B2 5/2006 Breed et al.
7,056,033 B2 6/2006 Castellon
7,067,794 B2 6/2006 Le Gallo et al.
7,070,226 B2 7/2006 Cleland et al.
7,071,023 B2 7/2006 Bertin et al.
7,073,291 B2 7/2006 Kawanobe et al.
7,075,256 B2 7/2006 Murray
7,086,687 B2 8/2006 Aoki et al.
7,095,200 B2 8/2006 Shinohara et al.
7,099,136 B2 8/2006 Seale et al.
7,102,089 B2 9/2006 Burgess et al.
7,104,589 B2 9/2006 Takeda et al.
7,109,677 B1 9/2006 Gagnon et al.
7,115,823 B1 10/2006 Anaya-Burgos
7,123,487 B2 10/2006 Saito et al.
7,132,642 B2 11/2006 Shank et al.
7,135,946 B2 11/2006 Hoffmann
7,137,541 B2 11/2006 Baskar et al.
7,138,595 B2 11/2006 Berry et al.
7,138,669 B2 11/2006 Lanzerotti et al.
7,139,158 B2 11/2006 Niayesh et al.
7,140,151 B2 11/2006 Spaziani et al.
7,143,548 B2 12/2006 Kleinmann et al.
7,144,068 B2 12/2006 Oxley et al.
7,145,761 B2 12/2006 Shimizu et al.
7,151,220 B1 12/2006 Rubin de la Borbolla
7,151,331 B2 12/2006 Niayesh et al.
7,152,695 B2 12/2006 Happ et al.
7,161,106 B2 1/2007 Kohatsu et al.
7,161,787 B2 1/2007 Joens
7,165,457 B2 * 1/2007 Ogino et al. .................... 73/700
7,173,514 B2 2/2007 Mullet et al.
7,174,674 B2 2/2007 Hattori et al.
7,179,995 B2 2/2007 Dinh
7,183,508 B2 2/2007 Kasai
7,183,672 B2 2/2007 Lewis
7,186,270 B2 3/2007 Elkins
7,187,146 B2 3/2007 Saito et al.
7,202,674 B2 4/2007 Nakano et al.
7,202,764 B2 4/2007 Deligianni et al.
7,205,734 B2 4/2007 Kidokoro
7,208,680 B2 4/2007 Drane
7,211,975 B2 5/2007 Murray et al.
7,224,136 B2 5/2007 Saitou et al.
7,226,112 B2 6/2007 Ward
7,227,447 B2 6/2007 Ohtaki et al.
7,228,883 B1 6/2007 Murray
7,230,354 B2 6/2007 Lewis
7,243,461 B2 7/2007 Rogers, Jr. et al.
7,244,148 B2 7/2007 Maguire et al.
7,244,213 B2 7/2007 Gueler et al.
7,250,571 B2 7/2007 Magno
7,250,736 B2 7/2007 Hirai
7,259,410 B2 8/2007 Jaiprakash et al.
7,265,311 B1 9/2007 Schaltenbrand et al.
7,269,924 B2 9/2007 Otomo et al.
7,282,656 B2 10/2007 Niiyama
7,283,023 B2 10/2007 Robert
7,285,877 B2 10/2007 Gorti et al.
7,289,014 B2 10/2007 Mullet et al.
7,289,310 B1 10/2007 Yuan
7,301,099 B1 11/2007 Korcz
7,305,290 B2 12/2007 Russ et al.
7,307,395 B2 12/2007 Bouamra et al.
7,309,971 B2 12/2007 Honma et al.
7,312,414 B2 12/2007 Yatsu et al.
7,315,228 B2 1/2008 Dooley
7,319,301 B2 1/2008 Pribisic
7,323,638 B1 1/2008 Radosavljevic
7,329,822 B1 2/2008 Orrico
7,339,401 B2 3/2008 Bertin et al.
7,342,190 B2 3/2008 Burgess et al.
7,345,252 B2 3/2008 Takenaka et al.
7,359,783 B2 4/2008 Vives et al.
7,360,635 B2 4/2008 Rhodes et al.
7,362,068 B2 4/2008 Yamamoto
7,365,279 B2 4/2008 Beerling
7,365,622 B2 4/2008 Kajan et al.
7,375,299 B1 5/2008 Pudney
7,381,913 B2 6/2008 Sjostrom
7,385,154 B2 6/2008 Klug
7,426,803 B2 9/2008 Fronz et al.
7,439,636 B2 10/2008 Lewis
7,462,792 B1 12/2008 Hellmers et al.
7,488,906 B2 2/2009 Taguchi et al.
7,498,923 B2 3/2009 Iversen
7,499,254 B2 3/2009 Joens
7,514,641 B2 4/2009 Kohatsu et al.
7,530,850 B2 5/2009 Maguire et al.
7,531,743 B2 5/2009 Johnson et al.
7,535,327 B2 5/2009 Desilva et al.
7,541,759 B2 6/2009 Hirai
7,542,334 B2 6/2009 Bertin et al.
7,548,809 B2 6/2009 Westerhoff
7,570,001 B2 8/2009 Noro et al.
7,581,314 B2 9/2009 Deligianni et al.
7,583,508 B2 9/2009 Hagiwara et al.
7,588,960 B2 9/2009 Bertin et al.
7,605,554 B2 10/2009 Kunkel
2001/0013200 A1 8/2001 Fink
2001/0017587 A1 8/2001 Suzuki et al.
2001/0024063 A1 9/2001 Sasaki

| | | | |
|---|---|---|---|
| 2001/0027146 | A1 | 10/2001 | Spaziani et al. |
| 2001/0030520 | A1 | 10/2001 | Losey et al. |
| 2001/0042820 | A1 | 11/2001 | Wilson |
| 2001/0048280 | A1 | 12/2001 | Wilson |
| 2002/0014871 | A1 | 2/2002 | Sugawara |
| 2002/0024308 | A1 | 2/2002 | Kato et al. |
| 2002/0039008 | A1 | 4/2002 | Edgar et al. |
| 2002/0040266 | A1 | 4/2002 | Edgar et al. |
| 2002/0043948 | A1 | 4/2002 | Ogasawara |
| 2002/0046815 | A1 | 4/2002 | Taniguchi |
| 2002/0047678 | A1 | 4/2002 | Wilson |
| 2002/0088283 | A1 | 7/2002 | Kume |
| 2002/0093420 | A1 | 7/2002 | Sicuranza |
| 2002/0101098 | A1 | 8/2002 | Schober et al. |
| 2002/0113602 | A1 | 8/2002 | Ishihara et al. |
| 2002/0117985 | A1 | 8/2002 | Buchheit et al. |
| 2002/0143452 | A1 | 10/2002 | Losey |
| 2002/0152684 | A1 | 10/2002 | Fink |
| 2002/0154012 | A1 | 10/2002 | Risi |
| 2002/0180269 | A1 | 12/2002 | Dalakuras et al. |
| 2002/0189168 | A1 | 12/2002 | Sicuranza |
| 2002/0190677 | A1 | 12/2002 | Gerbetz |
| 2002/0190679 | A1 | 12/2002 | Lamm |
| 2002/0190680 | A1 | 12/2002 | Gerbetz |
| 2003/0006728 | A1 | 1/2003 | Spreng et al. |
| 2003/0011336 | A1 | 1/2003 | Kramer et al. |
| 2003/0030299 | A1 | 2/2003 | Cleland et al. |
| 2003/0062865 | A1 | 4/2003 | Mullet et al. |
| 2003/0076062 | A1 | 4/2003 | Mullet et al. |
| 2003/0085679 | A1 | 5/2003 | Bledin et al. |
| 2003/0111995 | A1 | 6/2003 | Otte |
| 2003/0111996 | A1 | 6/2003 | Otte |
| 2003/0115801 | A1 | 6/2003 | Gosicki et al. |
| 2003/0140565 | A1 | 7/2003 | Otomo et al. |
| 2003/0151382 | A1 | 8/2003 | Daniels et al. |
| 2003/0174044 | A1 | 9/2003 | Murray |
| 2003/0210005 | A1 | 11/2003 | Murray |
| 2003/0222610 | A1 | 12/2003 | Whinnery |
| 2003/0222614 | A1 | 12/2003 | Whinnery et al. |
| 2003/0225497 | A1 | 12/2003 | Whinnery |
| 2003/0233183 | A1 | 12/2003 | Nuber |
| 2003/0234543 | A1 | 12/2003 | Onozawa et al. |
| 2004/0040771 | A1 | 3/2004 | Ploucha |
| 2004/0056199 | A1 | 3/2004 | O'Connor et al. |
| 2004/0061462 | A1 | 4/2004 | Bent et al. |
| 2004/0070316 | A1 | 4/2004 | Neubauer et al. |
| 2004/0079867 | A1 | 4/2004 | Le Gallo et al. |
| 2004/0090203 | A1 | 5/2004 | Appel et al. |
| 2004/0099382 | A1 | 5/2004 | Mullet et al. |
| 2004/0104701 | A1 | 6/2004 | Ohshima |
| 2004/0108171 | A1 | 6/2004 | De Coi |
| 2004/0111970 | A1 | 6/2004 | Fenelon |
| 2004/0112139 | A1 | 6/2004 | Ogino et al. |
| 2004/0112662 | A1 | 6/2004 | Ogino et al. |
| 2004/0116499 | A1 | 6/2004 | Mayser et al. |
| 2004/0124662 | A1 | 7/2004 | Cleland et al. |
| 2004/0124972 | A1 | 7/2004 | Strzelczyk |
| 2004/0130285 | A1 | 7/2004 | Le Gallo |
| 2004/0134129 | A1 | 7/2004 | Hattori et al. |
| 2004/0136659 | A1 | 7/2004 | Castellon |
| 2004/0138843 | A1 | 7/2004 | Bouamra et al. |
| 2004/0139656 | A1 | 7/2004 | Takeda et al. |
| 2004/0164693 | A1 | 8/2004 | Murray et al. |
| 2004/0172879 | A1 | 9/2004 | Regnet et al. |
| 2004/0187391 | A1 | 9/2004 | Fenelon |
| 2004/0189046 | A1 | 9/2004 | Kawanobe et al. |
| 2004/0215382 | A1 | 10/2004 | Breed et al. |
| 2004/0216393 | A1 | 11/2004 | Rogers, Jr. et al. |
| 2004/0222759 | A1 | 11/2004 | Ohshima |
| 2004/0236478 | A1 | 11/2004 | Le Gallo et al. |
| 2004/0261317 | A1 | 12/2004 | Murray |
| 2005/0012482 | A1 | 1/2005 | Kidokoro |
| 2005/0012484 | A1 | 1/2005 | Gifford et al. |
| 2005/0016290 | A1 | 1/2005 | Shank et al. |
| 2005/0017460 | A1 | 1/2005 | Hofmann et al. |
| 2005/0017600 | A1 | 1/2005 | Nomerange |
| 2005/0017667 | A1 | 1/2005 | Yamamoto |
| 2005/0030153 | A1 | 2/2005 | Mullet et al. |
| 2005/0043872 | A1 | 2/2005 | Heyn |
| 2005/0046584 | A1 | 3/2005 | Breed |
| 2005/0067987 | A1 | 3/2005 | Nakazawa et al. |
| 2005/0072049 | A1 | 4/2005 | Spaziani et al. |
| 2005/0073852 | A1 | 4/2005 | Ward |
| 2005/0083003 | A1 | 4/2005 | Mochizuki et al. |
| 2005/0083004 | A1 | 4/2005 | Yamamoto et al. |
| 2005/0092097 | A1 | 5/2005 | Shank et al. |
| 2005/0103117 | A1 | 5/2005 | Ogino et al. |
| 2005/0110300 | A1 | 5/2005 | Oxley et al. |
| 2005/0117270 | A1 | 6/2005 | Scherraus |
| 2005/0134426 | A1 | 6/2005 | Mullet et al. |
| 2005/0146298 | A1 | 7/2005 | Murray |
| 2005/0151495 | A1 | 7/2005 | Miyauchi |
| 2005/0160673 | A1 | 7/2005 | Kleinmann et al. |
| 2005/0160675 | A1 | 7/2005 | Fenelon |
| 2005/0168010 | A1 | 8/2005 | Cleland et al. |
| 2005/0177977 | A1 | 8/2005 | Hattori et al. |
| 2005/0179409 | A1 | 8/2005 | Honma et al. |
| 2005/0179445 | A1 | 8/2005 | Nakano et al. |
| 2005/0187688 | A1 | 8/2005 | Bigorra Vives et al. |
| 2005/0187689 | A1 | 8/2005 | Westerhoff |
| 2005/0203690 | A1 | 9/2005 | Russ et al. |
| 2005/0235564 | A1 | 10/2005 | Fronz et al. |
| 2005/0246054 | A1 | 11/2005 | Fink |
| 2005/0264033 | A1 | 12/2005 | Aoki et al. |
| 2005/0269038 | A1 | 12/2005 | Murakami et al. |
| 2005/0275363 | A1 | 12/2005 | Honma et al. |
| 2005/0276449 | A1 | 12/2005 | Pedemas et al. |
| 2005/0277512 | A1 | 12/2005 | Gueler et al. |
| 2006/0006823 | A1 | 1/2006 | Ferretti |
| 2006/0022618 | A1 | 2/2006 | Rhodes et al. |
| 2006/0028159 | A1 | 2/2006 | Otomo et al. |
| 2006/0090400 | A1 | 5/2006 | Los et al. |
| 2006/0131915 | A1 | 6/2006 | Ogino et al. |
| 2006/0151231 | A1 | 7/2006 | Bucksch et al. |
| 2006/0178795 | A1 | 8/2006 | Queveau et al. |
| 2006/0282204 | A1 | 12/2006 | Breed |
| 2006/0288642 | A1 | 12/2006 | Marentette |
| 2007/0084120 | A1 | 4/2007 | Kobayashi et al. |
| 2007/0125000 | A1 | 6/2007 | Fenelon |
| 2007/0183182 | A1 | 8/2007 | Pribisic |
| 2008/0052996 | A1 | 3/2008 | Sugiura |
| 2008/0065296 | A1 | 3/2008 | Stolz |
| 2008/0136358 | A1 | 6/2008 | Newman et al. |
| 2008/0190028 | A1 | 8/2008 | Oxley et al. |
| 2008/0204047 | A1 | 8/2008 | Wern et al. |
| 2008/0229667 | A1 | 9/2008 | Dufour et al. |
| 2008/0244984 | A1 | 10/2008 | Kelly |
| 2008/0295408 | A1 | 12/2008 | Heissler |
| 2008/0296927 | A1 | 12/2008 | Gisler et al. |
| 2008/0297076 | A1 | 12/2008 | Sakai et al. |
| 2008/0302014 | A1 | 12/2008 | Szczerba et al. |
| 2009/0000197 | A1 | 1/2009 | Brown |
| 2009/0000424 | A1 | 1/2009 | Taubmann et al. |
| 2009/0058347 | A1 | 3/2009 | Whinnery |
| 2009/0100755 | A1 | 4/2009 | Ishihara |
| 2009/0100758 | A1 | 4/2009 | Nagakura |
| 2009/0107050 | A1 | 4/2009 | Suzuki |
| 2009/0139142 | A1 | 6/2009 | Li |
| 2009/0173006 | A1 | 7/2009 | Jitsuishi et al. |
| 2009/0206784 | A1 | 8/2009 | Inoue et al. |
| 2009/0211156 | A1 | 8/2009 | Appel |
| 2009/0217596 | A1 | 9/2009 | Neundorf et al. |
| 2009/0222174 | A1 | 9/2009 | Frommer et al. |
| 2009/0229183 | A1 | 9/2009 | Kamiya |
| 2009/0260289 | A1 | 10/2009 | Carpenter et al. |
| 2009/0265989 | A1 | 10/2009 | Mueller et al. |
| 2009/0272035 | A1 | 11/2009 | Boisvert et al. |

FOREIGN PATENT DOCUMENTS

| | | | |
|---|---|---|---|
| DE | 1660737 | A1 | 4/1971 |
| DE | 1660738 | A1 | 8/1971 |
| DE | 2729738 | A1 | 4/1979 |
| DE | 7936058 | U1 | 4/1980 |
| DE | 8011510 | U1 | 7/1980 |
| DE | 8104702 | U1 | 11/1981 |
| DE | 3130473 | A1 | 2/1983 |
| DE | 8433857 | U1 | 4/1985 |
| DE | 3507922 | A1 | 9/1986 |

| | | | |
|---|---|---|---|
| DE | 4002026 | A1 | 9/1990 |
| DE | 3915931 | A1 | 11/1990 |
| DE | 9014432 | U1 | 1/1991 |
| DE | 3930644 | A1 | 3/1991 |
| DE | 9306553 | U1 | 8/1993 |
| DE | 9311354 | U1 | 9/1993 |
| DE | 4240622 | A1 | 6/1994 |
| DE | 9403972 | U1 | 7/1994 |
| DE | 9407645 | U1 | 7/1994 |
| DE | 9311632 | U1 | 9/1994 |
| DE | 9414962 | U1 | 11/1994 |
| DE | 4321139 | A1 | 1/1995 |
| DE | 4328167 | A1 | 3/1995 |
| DE | 9415040 | U1 | 10/1995 |
| DE | 4422698 | A1 | 1/1996 |
| DE | 4433957 | A1 | 3/1996 |
| DE | 19529079 | A1 | 2/1997 |
| DE | 19531550 | A1 | 3/1997 |
| DE | 19538071 | A1 | 4/1997 |
| DE | 19538073 | A1 | 4/1997 |
| DE | 9321338 | U1 | 6/1997 |
| DE | 19546504 | A1 | 6/1997 |
| DE | 19602744 | A1 | 7/1997 |
| DE | 19604128 | C1 | 8/1997 |
| DE | 19615548 | A1 | 10/1997 |
| DE | 19629671 | A1 | 1/1998 |
| DE | 19632592 | C1 | 1/1998 |
| DE | 4329535 | C2 | 3/1998 |
| DE | 19632590 | C1 | 3/1998 |
| DE | 19632591 | C1 | 3/1998 |
| DE | 19913106 | C1 | 5/2000 |
| DE | 19913105 | A1 | 10/2000 |
| DE | 19925050 | A1 | 12/2000 |
| DE | 20013310 | U1 | 12/2000 |
| DE | 20015330 | U1 | 3/2001 |
| DE | 19948321 | A1 | 4/2001 |
| DE | 10046974 | A1 | 10/2001 |
| DE | 10046975 | A1 | 5/2002 |
| DE | 10109005 | A1 | 9/2002 |
| DE | 10109280 | A1 | 9/2002 |
| DE | 10133644 | A1 | 4/2003 |
| DE | 10140930 | C1 | 6/2003 |
| DE | 20204796 | U1 | 9/2003 |
| DE | 10221315 | A1 | 11/2003 |
| DE | 10046975 | B4 | 4/2004 |
| DE | 202004014861 | U1 | 1/2005 |
| DE | 10310066 | B3 | 2/2005 |
| DE | 10349650 | A1 | 5/2005 |
| DE | 202005008450 | U1 | 10/2005 |
| DE | 10220187 | B4 | 11/2005 |
| DE | 20221517 | U1 | 3/2006 |
| DE | 102004055476 | B3 | 3/2006 |
| DE | 102004060328 | A1 | 6/2006 |
| DE | 102005028739 | B3 | 6/2006 |
| DE | 102005016252 | B3 | 2/2007 |
| DE | 102006015687 | A1 | 10/2007 |
| DE | 102004002415 | B4 | 7/2008 |
| DE | 102008010074 | B3 | 2/2009 |
| DE | 202008013508 | U1 | 2/2009 |
| DE | 102007050352 | A1 | 4/2009 |
| DE | 102008050897 | A1 | 7/2009 |
| EP | 0259573 | A1 | 3/1988 |
| EP | 0296134 | A1 | 12/1988 |
| EP | 0215037 | B1 | 8/1989 |
| EP | 0425628 | B1 | 5/1990 |
| EP | 0408537 | A1 | 1/1991 |
| EP | 0489610 | A1 | 6/1992 |
| EP | 0326623 | B1 | 3/1993 |
| EP | 0638701 | A2 | 9/1993 |
| EP | 0625283 | B1 | 11/1993 |
| EP | 0630588 | A2 | 5/1994 |
| EP | 0615047 | A1 | 9/1994 |
| EP | 0640740 | A1 | 3/1995 |
| EP | 0562076 | B1 | 6/1995 |
| EP | 0663981 | B1 | 7/1995 |
| EP | 0730743 | B1 | 9/1995 |
| EP | 0666956 | B1 | 7/1997 |
| EP | 0782158 | A2 | 7/1997 |
| EP | 0803628 | A2 | 10/1997 |
| EP | 0812049 | A1 | 12/1997 |
| EP | 0673464 | B1 | 8/1998 |
| EP | 0901210 | A3 | 9/1999 |
| EP | 0823957 | B1 | 12/1999 |
| EP | 1017145 | A2 | 7/2000 |
| EP | 1031696 | A2 | 8/2000 |
| EP | 1081829 | A1 | 3/2001 |
| EP | 1091062 | A2 | 4/2001 |
| EP | 1096089 | A2 | 5/2001 |
| EP | 1134631 | A2 | 9/2001 |
| EP | 1186456 | A2 | 9/2001 |
| EP | 1146191 | A1 | 10/2001 |
| EP | 1167675 | A1 | 1/2002 |
| EP | 1176687 | A2 | 1/2002 |
| EP | 1180443 | A1 | 2/2002 |
| EP | 1275313 | A2 | 6/2002 |
| EP | 1286478 | A1 | 6/2002 |
| EP | 1221705 | A2 | 7/2002 |
| EP | 0842504 | B1 | 8/2002 |
| EP | 1271739 | A1 | 1/2003 |
| EP | 0910718 | B1 | 3/2003 |
| EP | 1298275 | A1 | 4/2003 |
| EP | 1304442 | A2 | 4/2003 |
| EP | 1464786 | A1 | 4/2003 |
| EP | 1003950 | B1 | 5/2003 |
| EP | 1321324 | A1 | 6/2003 |
| EP | 1079983 | B1 | 2/2004 |
| EP | 0853714 | B1 | 3/2004 |
| EP | 1361095 | A3 | 3/2004 |
| EP | 108251 | B1 | 4/2004 |
| EP | 1159504 | B1 | 5/2004 |
| EP | 1422090 | A1 | 5/2004 |
| EP | 0883724 | B1 | 6/2004 |
| EP | 1431094 | A1 | 6/2004 |
| EP | 1431095 | A1 | 6/2004 |
| EP | 1502817 | A1 | 7/2004 |
| EP | 1455044 | A2 | 9/2004 |
| EP | 1467461 | A1 | 10/2004 |
| EP | 1469332 | A1 | 10/2004 |
| EP | 1526241 | A1 | 10/2004 |
| EP | 1361096 | A3 | 11/2004 |
| EP | 1402639 | B1 | 11/2004 |
| EP | 1484466 | A2 | 12/2004 |
| EP | 0826095 | B1 | 1/2005 |
| EP | 1057673 | B1 | 1/2005 |
| EP | 1474582 | B1 | 4/2005 |
| EP | 1259692 | B1 | 8/2005 |
| EP | 1564357 | A2 | 8/2005 |
| EP | 1566510 | A2 | 8/2005 |
| EP | 1371803 | B1 | 9/2005 |
| EP | 1586732 | A2 | 10/2005 |
| EP | 1589177 | A1 | 10/2005 |
| EP | 1103009 | B1 | 12/2005 |
| EP | 1602518 | A2 | 12/2005 |
| EP | 1607562 | A1 | 12/2005 |
| EP | 1607564 | A1 | 12/2005 |
| EP | 1617030 | A2 | 1/2006 |
| EP | 1039084 | B1 | 2/2006 |
| EP | 1509824 | B1 | 2/2006 |
| EP | 1621712 | A1 | 2/2006 |
| EP | 1637682 | A1 | 3/2006 |
| EP | 1476627 | B1 | 5/2006 |
| EP | 1652710 | A2 | 5/2006 |
| EP | 1655436 | A2 | 5/2006 |
| EP | 0992410 | B1 | 6/2006 |
| EP | 1672151 | A2 | 6/2006 |
| EP | 1691015 | A1 | 8/2006 |
| EP | 1250507 | B1 | 10/2006 |
| EP | 1504167 | B1 | 10/2006 |
| EP | 1722339 | A1 | 11/2006 |
| EP | 1726761 | A1 | 11/2006 |
| EP | 1446544 | B1 | 9/2007 |
| EP | 1015723 | B1 | 10/2007 |
| EP | 1842998 | A2 | 10/2007 |
| EP | 1842999 | A2 | 10/2007 |
| EP | 1854677 | A1 | 11/2007 |
| EP | 1854953 | A2 | 11/2007 |
| EP | 1884616 | A1 | 2/2008 |
| EP | 1715127 | B1 | 3/2008 |

| | | | |
|---|---|---|---|
| EP | 1918493 | A2 | 5/2008 |
| EP | 1709276 | B1 | 6/2008 |
| EP | 1953569 | A1 | 8/2008 |
| EP | 1959321 | A2 | 8/2008 |
| EP | 2048014 | A2 | 9/2008 |
| EP | 1265767 | B1 | 10/2008 |
| EP | 1487653 | B1 | 10/2008 |
| EP | 1975361 | A2 | 10/2008 |
| EP | 1447511 | A3 | 12/2008 |
| EP | 1997996 | A1 | 12/2008 |
| EP | 2093365 | A2 | 1/2009 |
| EP | 1690713 | B1 | 2/2009 |
| EP | 2055881 | A2 | 5/2009 |
| EP | 2101023 | A2 | 9/2009 |
| JP | 6260054 | A | 9/1994 |
| JP | 2009090667 | A | 4/2009 |
| JP | 2009121054 | A2 | 6/2009 |
| JP | 2009161966 | A2 | 7/2009 |
| JP | 2009161967 | A2 | 7/2009 |
| JP | 2009161968 | A2 | 7/2009 |
| JP | 2009167606 | A2 | 7/2009 |
| JP | 2009167632 | A2 | 7/2009 |
| WO | 84/00992 | A1 | 3/1984 |
| WO | 86/05317 | A1 | 9/1986 |
| WO | 90/14677 | A1 | 11/1990 |
| WO | 93/08356 | A1 | 4/1993 |
| WO | 94/08121 | A1 | 4/1994 |
| WO | 94/12996 | A1 | 6/1994 |
| WO | 94/22212 | A1 | 9/1994 |
| WO | 95/09959 | A1 | 4/1995 |
| WO | 95/25380 | A1 | 9/1995 |
| WO | 96/09559 | A1 | 3/1996 |
| WO | 96/35036 | A1 | 11/1996 |
| WO | 96/35037 | A1 | 11/1996 |
| WO | 96/41087 | A1 | 12/1996 |
| WO | 97/01835 | A1 | 1/1997 |
| WO | 97/06518 | A1 | 2/1997 |
| WO | 97/22775 | A1 | 6/1997 |
| WO | 97/22776 | A1 | 6/1997 |
| WO | 97/32102 | A1 | 9/1997 |
| WO | 97/40402 | A1 | 10/1997 |
| WO | 98/02631 | A1 | 1/1998 |
| WO | 98/26145 | A1 | 6/1998 |
| WO | 99/01637 | A1 | 1/1999 |
| WO | 99/09282 | A1 | 2/1999 |
| WO | 99/53345 | A1 | 10/1999 |
| WO | 99/53589 | A1 | 10/1999 |
| WO | 00/12421 | A1 | 3/2000 |
| WO | 00/53878 | A1 | 9/2000 |
| WO | 00/57013 | A1 | 9/2000 |
| WO | 00/58119 | A1 | 10/2000 |
| WO | 01/14676 | A1 | 3/2001 |
| WO | 01/29356 | A1 | 4/2001 |
| WO | 01/36772 | A1 | 5/2001 |
| WO | 01/53640 | A1 | 7/2001 |
| WO | 01/56142 | A1 | 8/2001 |
| WO | 01/65044 | A1 | 9/2001 |
| WO | 01/66372 | A2 | 9/2001 |
| WO | 02/12699 | A1 | 2/2002 |
| WO | 02/27132 | A1 | 4/2002 |
| WO | 02/38905 | A2 | 5/2002 |
| WO | 02/068389 | A2 | 9/2002 |
| WO | 02/068424 | A1 | 9/2002 |
| WO | 02/073787 | A1 | 9/2002 |
| WO | 02/082613 | A1 | 10/2002 |

| | | | |
|---|---|---|---|
| WO | 02/087912 | A1 | 11/2002 |
| WO | 02/097947 | A2 | 12/2002 |
| WO | 02/101929 | A2 | 12/2002 |
| WO | 02/103874 | A2 | 12/2002 |
| WO | 03/016966 | A2 | 2/2003 |
| WO | 03/036774 | A1 | 5/2003 |
| WO | 03/038220 | A1 | 5/2003 |
| WO | 03/038221 | A1 | 5/2003 |
| WO | 03/063318 | A1 | 7/2003 |
| WO | 03/069104 | A1 | 8/2003 |
| WO | 03/074308 | A1 | 9/2003 |
| WO | 03/078776 | A2 | 9/2003 |
| WO | 03/095779 | A1 | 11/2003 |
| WO | 03/102338 | A2 | 12/2003 |
| WO | 03/102339 | A2 | 12/2003 |
| WO | 03/103349 | A2 | 12/2003 |
| WO | 04/001438 | A2 | 12/2003 |
| WO | 2004/018817 | A2 | 3/2004 |
| WO | 2004/029565 | A2 | 4/2004 |
| WO | 2004/031520 | A1 | 4/2004 |
| WO | 2004/054834 | A1 | 7/2004 |
| WO | 2004/054835 | A1 | 7/2004 |
| WO | 2004/063512 | A1 | 7/2004 |
| WO | 2004/022895 | A1 | 9/2004 |
| WO | 2004/084609 | A2 | 10/2004 |
| WO | 2004/088074 | A2 | 10/2004 |
| WO | 2004/090273 | A1 | 10/2004 |
| WO | 2005/059285 | A1 | 6/2005 |
| WO | 2005/066442 | A1 | 7/2005 |
| WO | 2005/080727 | A2 | 9/2005 |
| WO | 2005/098186 | A1 | 10/2005 |
| WO | 2005/116385 | A1 | 12/2005 |
| WO | 2006/001002 | A1 | 1/2006 |
| WO | 2006/031185 | A1 | 3/2006 |
| WO | 2006/031599 | A1 | 3/2006 |
| WO | 2006/042236 | A2 | 4/2006 |
| WO | 2006/066524 | A1 | 6/2006 |
| WO | 2006/066535 | A1 | 6/2006 |
| WO | 2006/086892 | A1 | 8/2006 |
| WO | 2006/090161 | A2 | 8/2006 |
| WO | 2006/106078 | A2 | 10/2006 |
| WO | 2007/017014 | A1 | 2/2007 |
| WO | 2007/022355 | A2 | 2/2007 |
| WO | 2007/093910 | A2 | 8/2007 |
| WO | 2007/093912 | A1 | 8/2007 |
| WO | 2007/093914 | A1 | 8/2007 |
| WO | 2007/136943 | A1 | 11/2007 |
| WO | 2007/140493 | A1 | 12/2007 |
| WO | 2007/148178 | A1 | 12/2007 |
| WO | 2008/006424 | A2 | 1/2008 |
| WO | 2008/025422 | A2 | 3/2008 |
| WO | 2008/046514 | A2 | 4/2008 |
| WO | 2008/052523 | A1 | 5/2008 |
| WO | 2008/081026 | A1 | 7/2008 |
| WO | 2008/081029 | A1 | 7/2008 |
| WO | 2008/151573 | A1 | 12/2008 |
| WO | 2009/010798 | A1 | 1/2009 |
| WO | 2009/026912 | A1 | 3/2009 |
| WO | 2009/027819 | A2 | 3/2009 |
| WO | 2009/053677 | A1 | 4/2009 |
| WO | 2009/074088 | A1 | 6/2009 |
| WO | 2009/128910 | A1 | 10/2009 |

* cited by examiner

WIDE ACTIVATION ANGLE PINCH SENSOR SECTION AND SENSOR HOOK-ON ATTACHMENT PRINCIPLE

CROSS REFERENCE TO RELATED APPLICATIONS

This application claims priority to U.S. Provisional Patent Application No. 61/267,574, which is incorporated by reference herein in its entirety.

FIELD OF THE INVENTION

The invention relates to pinch sensors, particularly for vehicular closure panels where it is desirable to prevent a closure panel such as a lift gate or side door from closing if a foreign obstacle or object is detected just as the panel closes.

BACKGROUND OF THE INVENTION

It is known to apply pinch sensors to prevent a closure panel such as a lift gate or side door from closing if a foreign obstacle or object is detected just as the panel closes. The pinch sensors come in different forms, including non-contact sensors such as those based on capacitance changes, and contact sensors which rely on a physical deformation caused by contact with a foreign object.

The contact pinch sensors are typically applied in the form of a rubber strip which is routed along and adjacent to the periphery of a vehicle door. The rubber strip embeds two wires which are separated by an air gap. When the two wires contact one another, the electrical resistance therebetween drops, and a controller connected to the two wires monitors the drop in resistance, detecting an object when the drop exceeds a predetermined threshold. The fundamental problem with such conventional pinch sensors, however, is that they have a limited activation angle typically on the order of about thirty five degrees. Thus, in the event the pinch force is applied obliquely rather than head on, the wires may not contact one another.

SUMMARY OF THE INVENTION

The invention seeks to provide a resistive contact pinch sensor have a considerably wider activation range or angle. It is also desired to provide such a sensor with a low manufacturing cost.

According to one aspect of the invention a multi-lobed pinch sensor is provided. The pinch sensor includes a resiliently deformable non-conductive tubular casing having an outer wall and an inner wall that defines an internal hollow region. At least three electrically-conductive conduits are disposed along the inner wall of the casing. In section, the three electrically-conductive conduits are substantially equidistantly spaced circumferentially along the inner wall of the casing, and each electrically-conductive conduit has a periphery that extends into the hollow region. When the casing is suitably deformed, at least one of the electrically-conductive conduits comes into contact with a electrically conductive reference element to thereby lower the resistance therebetween and enable a controller to signal the detection of an obstacle.

In the pinch sensor each electrically-conductive conduit preferably comprises an elastomeric electrically-conductive skirt that envelops a low resistance electrical conductor connectable to a controller input.

In one embodiment, the casing has a cross-sectional shape of a semi-circular arch, including a base portion and a semi-circular portion. One of the electrically-conductive conduits is disposed along the base portion and functions as the reference element. The other two electrically-conductive conduits are disposed along the semi-circular portion. The internal hollow region includes two rebates that straddle the electrically-conductive reference conduit, where each rebate presents a pivot point enabling the casing to flex such that the corresponding electrically-conductive conduit disposed along the semi-circular portion is directed towards the electrically-conductive reference conduit.

In another embodiment, the conductive reference element is provided by an additional electrically-conductive core disposed within the casing inward of the three electrically-conductive conduits. The electrically-conductive core is connected to the casing by one or more non-conductive webs branching from the casing inner wall. The electrically-conductive core preferably has a tri-petal cross-sectional shape so as to trisect the internal hollow region into three air gaps. Each of the electrically-conductive conduits projects partially into one of the three individual air gaps, respectively. Each electrically-conductive conduit is preferably formed from an elastomeric electrically conductive skirt that envelopes a low resistance electrical conductor connectable to one of the controller inputs. These conductive skirts preferably have substantially similar circular cross-sectional profiles and the air gaps have substantially similar sector-shaped cross-sectional profiles of substantially uniform depth, thereby providing a substantially uniform travel for activating the sensor across an activation angle of at least 270 degrees.

According to another aspect of the invention a coaxial pinch sensor is provided. The coaxial pinch sensor includes a resiliently deformable non-conductive tubular casing. An electrically-conductive tubular conduit is disposed within the tubular casing, the tubular conduit having an inner wall defining an internal hollow region. An electrically-conductive core is disposed within the electrically-conductive tubular conduit and is normally spaced apart therefrom. When the casing is suitably deformed, the electrically-conductive tubular conduit comes into contact with the electrically-conductive core to thereby lower the resistance therebetween and enable a controller to signal the detection of an obstacle.

The coaxial pinch sensor prefereably including at least one non-conductive spacing element disposed between the electrically-conductive core and the electrically-conductive tubular conduit.

And the electrically-conductive core is preferably substantively coaxial with the electrically-conductive tubular conduit.

According to one embodiment of the coaxial pinch sensor, multiple non-conductive spacing elements are disposed between the electrically-conductive core and the electrically-conductive tubular conduit, these spacing elements being resiliently compressible. In addition, the electrically-conductive core is preferably segmented by a nonconductive divider having an end portion contacting the electrically-conductive tubular conduit. And the electrically-conductive core is preferably formed from an elastomeric electrically conductive skirt that envelops a low resistance electrical conductor.

According to another embodiment of the coaxial pinch sensor the electrically-conductive tubular conduit has a cross-sectional shape of a three-quarter cylinder having a base portion and a semi-circular portion. The spacer is connected to the base portion of the electrically-conductive tubular conduit. The electrically-conductive core has a semi-circular cross-sectional shape, and the hollow region includes an air gap that has a substantially sector-shaped cross-sectional profile of substantially uniform depth, thereby providing a substantially uniform travel for activating the sensor across an activation angle of at least 270 degrees.

BRIEF DESCRIPTION OF THE DRAWINGS

The foregoing and other aspects of the invention will be more readily appreciated having reference to the drawings, wherein.

DETAILED DESCRIPTION OF PREFERRED EMBODIMENTS

Figures 1A, 1B, 1C:
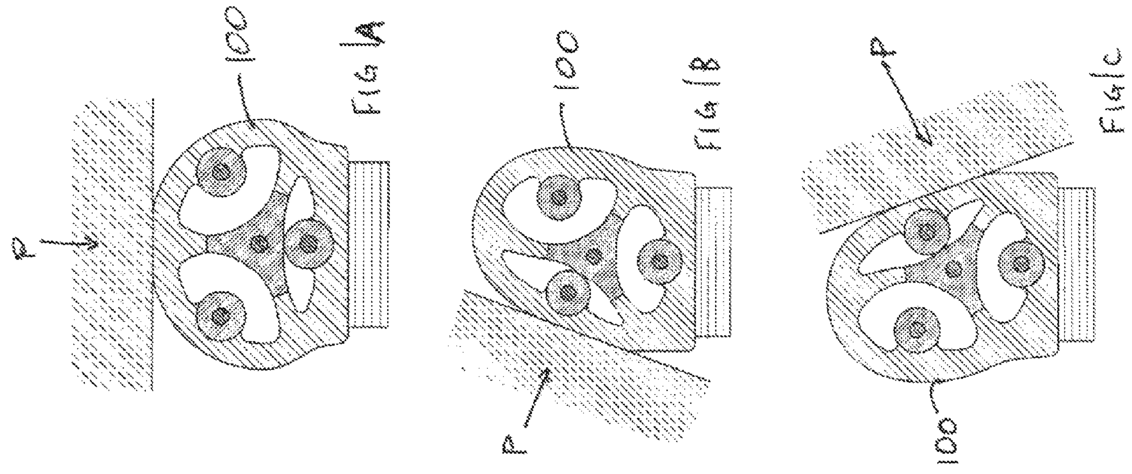
FIGS. 1A, 1B and 1C are cross-sectional views schematically demonstrating the deformation of the pinch sensor shown in FIG. 1 under loads directed from top, left and right directions, respectively.
Figure 1:
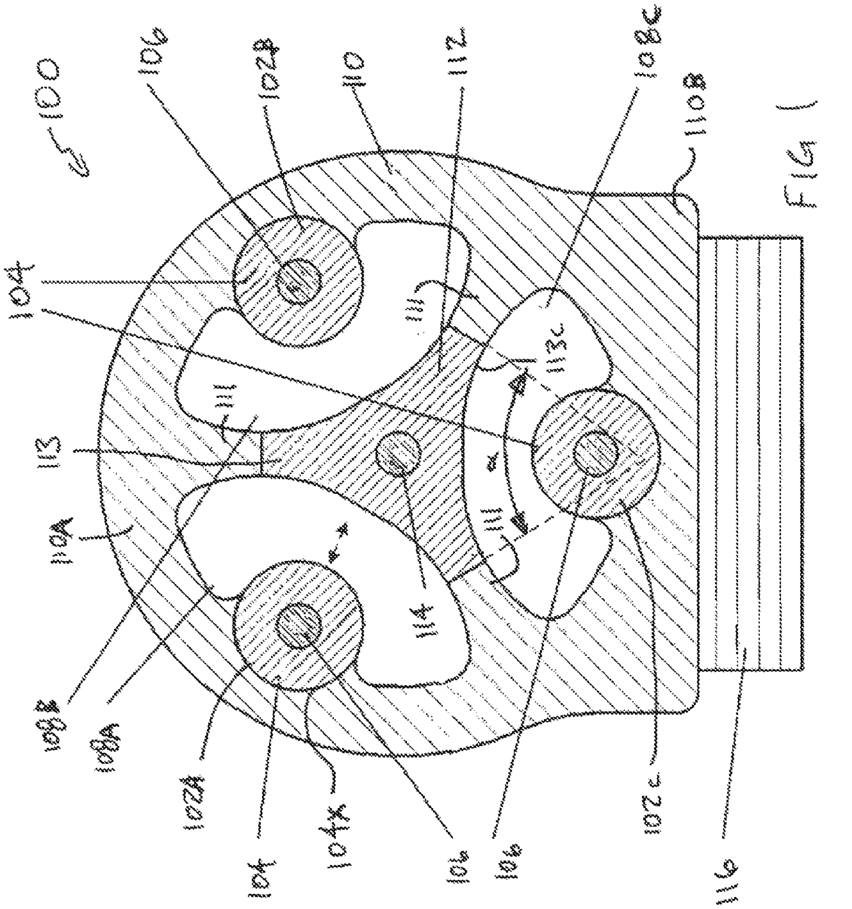
FIG. 1 is a cross-sectional view of a tri-lobed pinch sensor according to a first embodiment.

FIG. 1 shows a tri-lobed pinch sensor 100 in cross-sectional view. The sensor 100 is configured as an elongate bendable strip, but it should be understood that the cross-sectional profile shown in FIG. 1 is substantially constant along the length of the strip (and do not follow a helical pattern). As such, the pinch sensor 100 may be relatively easily manufactured by extrusion or co-extrusion techniques as known in the art per se.

The particular pinch sensor 100 shown in FIG. 1 achieves a relatively wide activation range or angle by incorporating three electrically-conductive conduits 102 (labeled individually as 102*a*, 102*b*, 102*c*) within a non-conductive tubular casing 110. In section, the electrically-conductive conduits 102, which are alternatively referred to as conductive 'planetary' lobes, are substantially equidistantly spaced circumferentially along the inner wall of the tubular casing 110 about a central electrically-conductive core 112. The planetary lobes 102 are insulated from the central conductive core 112 by a hollow region 108 but upon application of a suitable pinch force to deform the tubular casing 110 at least one of the conductive planetary lobes 102 will come into contact with the conductive central core 112. lowering the resistance therebetween, and enabling a controller (not shown) connected to the conductive planetary lobes 102 and central core 113 to signal the presence of an obstacle. The three conductive planetary lobes 102 can be connected to one voltage polarity, and the conductive central core 112 to an opposite voltage polarity.

More particularly, each planetary lobe 102 includes a conductive skirt 104 that is preferably formed from an elastomeric conductive material, e.g., conductive rubber as known in the art per se. The conductive skirt 104 surrounds a low resistance 'outboard' electrical conductor 106, discussed in greater detail below, that is connected to one of the controller inputs (all three electrical conductors being connectable to the same controller input). Each skirt 104 is preferably formed in a closed loop shape such as the illustrated circular shape so as to envelop the corresponding outboard electrical conductor 106, although it will be understood that a complete encirclement is not essential.

The central conductive core 112 includes a conductive tri-petal or trilateral body 113 that is preferably formed from the same material as the conductive skirt 104. The trilateral body 113 preferably surrounds a low resistance central electrical conductor 114 that is disposed along the longitudinal axis of the pinch sensor 100 and is connected to another input of the controller.

The three planetary lobes 102 are partially embedded in a resiliently deformable, non-conductive tubular casing 110, as may be provided by rubber, that forms the outer periphery of the sensor 100. The casing 110 encapsulates the conductive portions of the sensor, protecting it from ambient influences. The casing 110 also defines the stiffness of the section and its appearance. The casing 110 has a generally annular shaped peripheral cross-sectional profile (e.g., a three-quarter cylinder as illustrated) with three integrally formed, inwardly leading web portions 111. The central trilateral body 113 has three corners that are each integrally connected to one of three web portions 111 to thus trisect the casing 100 and define three distinct air gaps labeled individually as 108*a*, 108*b*, 108*c*.

In the illustrated embodiment about one half 104*j* of the outer periphery of each conductive skirt 104 abuts the casing 110, and about one half 104*k* of the outer periphery of each conductive skirt 104 projects into one of the air gaps 108*a*, 108*b*, 108*c*. Each air gap is preferably crescent or sector shaped in section with uniform depth and sized to permit about one hundred and eighty degrees of the outer periphery of the respective conductive skirt 104 to project into the air gap. The crescent or sector shape of the air gap 108, coupled with the circular shape of the planetary conductive skirt 104, also provides a relatively uniform depth d across the air gap 108 between the projecting portion 104*k* of the planetary conductive skirt 104 and the corresponding sidewall 113*a*, 113*b*, 113*c* of the central trilateral body 113. The distance d is selected to achieve a selected deformation of the casing 110 before one of the planetary lobes 102 contacts the central core 112, but in any event the preferred design ensures that the sensor 100 has a relatively constant activation travel over a wide range of pinch directions.

Each sidewall 112*a*, 112*b*, 112*c* of the central trilateral body 112 faces one of the projecting portions 104*k* of the planetary conductive skirt 104 and subtends it by an angle alpha of about one hundred twenty degrees. As the three planetary lobes 102 are angularly spaced apart from one another by about one hundred and twenty degrees, it will be seen that the pinch sensor 100 has a very wide activation angle. This can be appreciated more fully with additional reference to FIGS. 1A, 1B, and 1C which demonstrate how the sensor 100 reacts when a pinch force P is applied from top, left and right positions, respectively, and from which it should be appreciated that the sensor 100 has an activation angle of at least about two hundred and seventy degrees.

Figure 2:
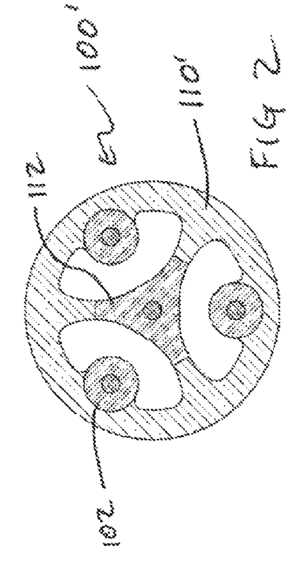
FIG. 2 is a cross-sectional view of a variant of the pinch sensor shown in FIG. 1.

As shown in FIG. 1 the casing 110 features a flattened end portion 110*b* in order to provide a flat surface to mount an adhesive strip 116 thereto for attaching the sensor to the contours of a support surface. It will be appreciated that in other embodiments such as shown in FIG. 2 a variant 100' of the pinch sensor can have a completely circular casing 110' which will thus permit an even larger activation angle.

In preferred embodiments the electrical conductors 106 and 114 are formed from multiple strands of wire such as copper combined with plastic reinforcing fiber. Such conductors can provide high elasticity in both axial (stretching) and transverse (bending) directions.

Figure 3A:
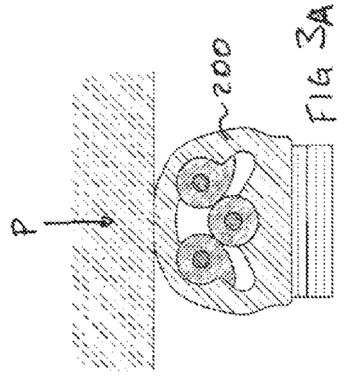
FIGS. 3A, 3B and 3C are cross-sectional views schematically demonstrating the deformation of the pinch sensor shown in FIG. 3 under loads directed from top, left and right directions, respectively.
Figure 3B:
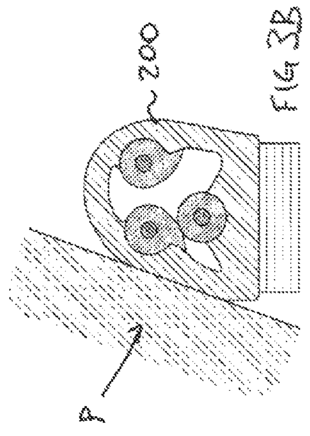
Figure 3C:
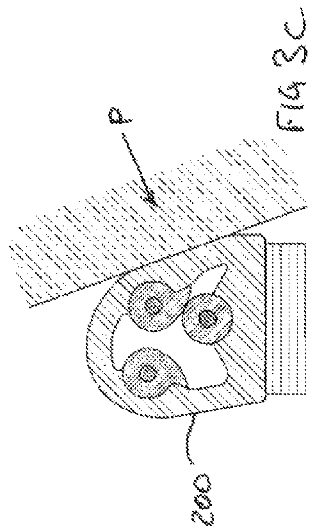
Figure 3:
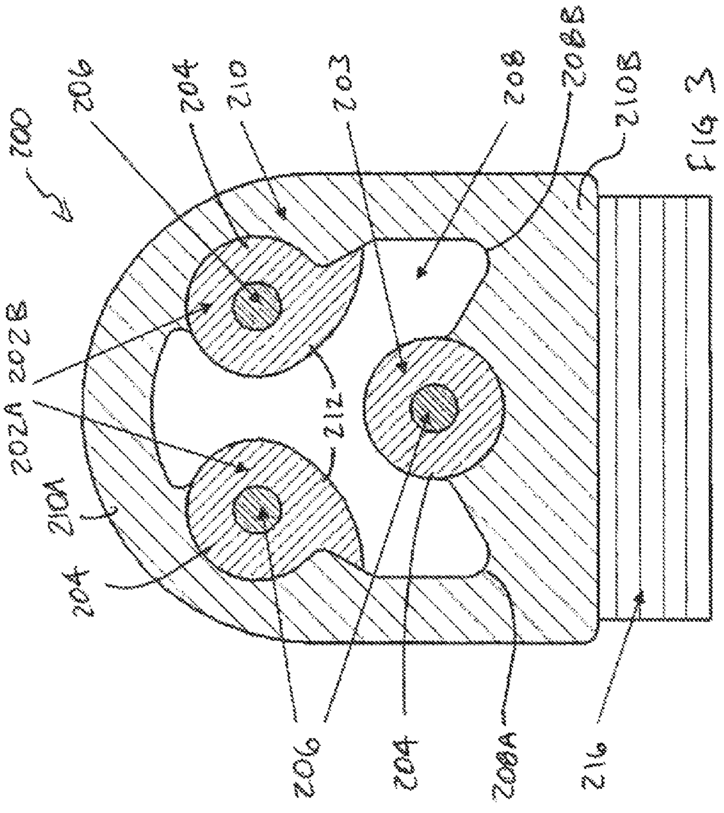
FIG. 3 is a cross-sectional view of a tri-lobed pinch sensor according to a second embodiment.

FIG. 3 shows an alternative embodiment of a tri-lobed pinch sensor 200 in cross-sectional view. The sensor 200 is configured as an elongate bendable strip, but it should be understood that the cross-sectional profile shown in FIG. 3 is substantially constant along the length of the strip (and does not follow a helical pattern), enabling the pinch sensor 200 to be relatively easily manufactured by extrusion or co-extrusion techniques.

The pinch sensor 200 achieves a relatively wide activation range or angle by incorporating three electrically-conductive conduits 202*a*, 202*b*, and 203 within a non-conductive tubular casing 210. In section, the electrically-conductive conduits 102, which are alternatively referred to as conductive lobes, are substantially equidistantly spaced circumferentially along the inner wall of the tubular casing 210 and/or about a central cylindrical axis 214. The upper lobes 202*a*, 202*b* are insulated from one another by a central, common, air gap 208, but upon application of a suitable pinch force to deform the tubular casing 210 one of the conductive upper lobes 202, which are connected to one input of a controller (not shown), will come into contact with the conductive lower or base lobe 203, which is connected to another input of the controller, lowering the resistance therebetween, and thus enabling the controller (not shown) to signal the presence of an obstacle.

More particularly, each conductive lobe 202, 203 includes a conductive skirt 204 that is preferably formed from an elastomeric conductive material, e.g., conductive rubber as known in the art per se. The conductive skirt 204 surrounds a low resistance electrical conductor 206, such as discussed above, that is connected to a controller input. Each skirt 204 is preferably formed in a closed loop shape such as the illustrated circular shape so as to envelop the corresponding electrical conductor 206, although it will be understood that a complete encirclement is not essential. The conductive skirts 204 of the upper lobes 202 also include teardrop shaped tail sections 212 that provides a wider face (in comparison with a strict circular profile) relative to the base lobe 203.

Each of the conductive lobes 202 is partially embedded in the resiliently deformable, non-conductive tubular casing 210, as may be provided by rubber, that forms the outer periphery of the sensor 200. The casing 210 encapsulates the conductive portions of the sensor, protecting it from ambient influences. The casing 210 also defines the stiffness of the section and its appearance. The particular casing 210 illustrated in FIG. 3 has a generally inverted U-shaped or semicircular arch profile in section, including a semicircle portion 210 and a base portion 201*b*. The casing 210 also includes a hollow central region that defines the air gap 208.

In the illustrated embodiment about one half of the outer periphery of each conductive skirt 204 abuts the tubular casing 210, and about one half of the outer periphery of each conductive skirt 204 projects into the air gap 208. The air gap 208 includes two lower recesses or rebates 208*a*, 208*b* that present pivot points to allow the casing 210 to flex such that the conductive upper lobes 202 are directed towards the conductive base lobe 203 that is situated adjacent the base of inverted U-shaped casing 210. The tri-lobed pinch sensor 200 also has a wide activation angle as will be appreciated more fully with additional reference to FIGS. 2A, 2B, and 2C which demonstrate how the sensor 200 reacts when a pinch force P is applied from top, left and right positions, respectively, and from which it should be appreciated that the sensor 200 has an activation angle of at least about two hundred and seventy degrees.

Figure 4:
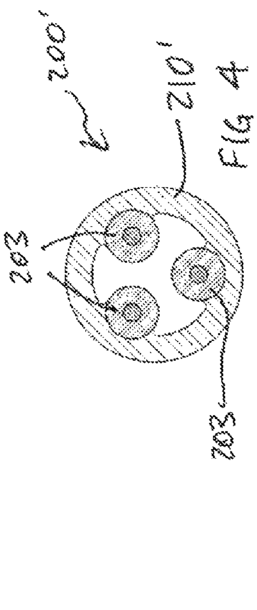
FIG. 4 is a cross-sectional view of a variant of the pinch sensor shown in FIG. 3.

As shown in FIG. 3 the flattened base portion 210*b* of the casing 210 provides a flat surface for mounting an adhesive strip 216 to attach the sensor to an underlying support surface. It will be appreciated that in other embodiments such as shown in FIG. 4 a variant 200' of the pinch sensor can have a completely circular casing 210' with three equidistantly angularly spaced circumferential conductive lobes 203, which will thus permit an even larger activation angle.

Figure 5A:
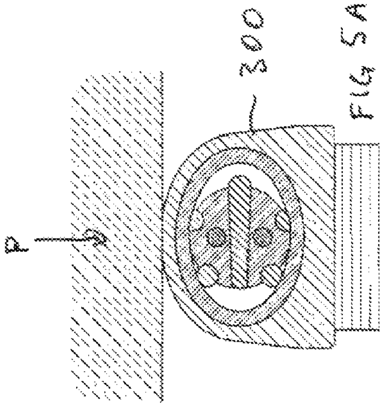
FIGS. 5A, 5B and 5C are cross-sectional views schematically demonstrating the deformation of the pinch sensor shown in FIG. 5 under loads directed from top, left and right directions, respectively.
Figure 5B:
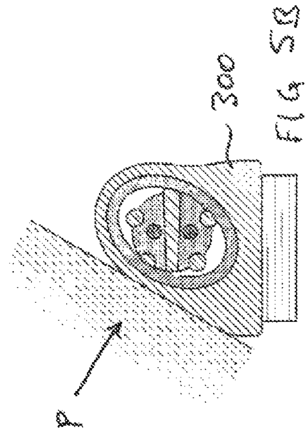
Figure 5C:
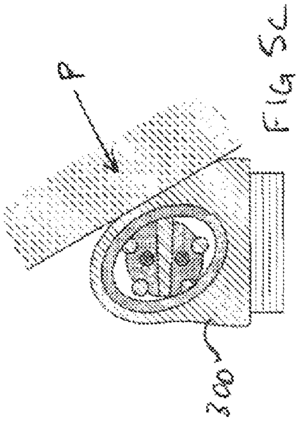
Figure 5:
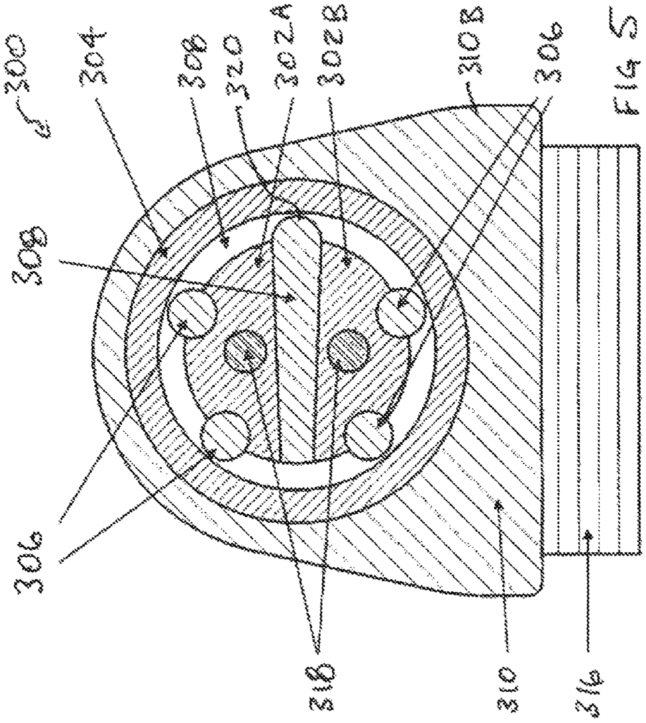
FIG. 5 is a cross-sectional view of a coaxial pinch sensor according to a third embodiment.

FIG. 5 shows an embodiment of a coaxial pinch sensor 300 in cross-sectional view. The sensor 300 is also configured as an elongate bendable strip, and it will be understood that the cross-sectional profile shown in FIG. 5 is substantially constant along the length of the strip.

The coaxial pinch sensor 300 achieves a wide activation range or angle by incorporating a central electrically-conductive core 302 and a coaxial electrically-conductive tubular outer sheath 304 within a tubular casing 310. The conductive core 302 and conductive sheath 304 are normally spaced apart by a plurality of spacers/springs 306, but upon application of a suitable pinch force to deform the tubular casing 310 the conductive sheath 304, which is connected to one input of a controller (not shown), will come into contact with the conductive core 302, which is connected to another input of the controller, lowering the resistance therebetween and enabling the controller (not shown) to signal the presence of an obstacle.

More particularly, the coaxial sensor 300 includes a resiliently deformable, non-conductive tubular casing 310, as may be provided by rubber, that forms the outer periphery of the sensor 300. The particular casing 310 illustrated in FIG. 5 has a cylindrical inner wall and encapsulates the conductive portions of the sensor, protecting it from ambient influences. The casing 310 also defines the stiffness of the section and its appearance. The particular casing 310 illustrated in FIG. 5 has a flattened base section 310*b* to which an adhesive foam strip 316 can be applied to mount the sensor to a support surface.

The casing 310 has an evacuated central region. The conductive outer sheath 304 is disposed immediately adjacent the inner wall of the casing 310 and is also preferably cylindrical to ensure a mating fit therewith. The central conductive core 302 is disposed within the outer sheath 304, being substantially coaxial therewith. The conductive core 302 also has a smaller diameter than the outer sheath 304 so as to leave an air gap 308 therebetween.

The conductive cylindrical outer sheath 304 is preferably formed from an elastomeric material, such as conductive rubber.

The central conductive core 302 is provided as two semi-cylinders 302*a*, 302*b* separated by a divider 314. Each semi-cylinder is preferably formed from an elastomeric conductive material, e.g., conductive rubber, and envelops a low resistance electrical conductor 318, such as discussed above, that is connected to a controller input.

The divider 314 is formed from a nonconductive material, such as rubber, and has a bulbous end portion 320 that contacts the cylindrical outer sheath 304. The divider 314 maintains a minimum spacing between the electrical conductors 318 embedded in the two semi-cylinders 302*a* and prevents the collapse of the section in the event the coaxial strip sensor 300 is routed with sharp bends thereto.

The spacers/springs 306 are non-conductive resiliently deformable beads that are partially embedded in the semi-cylinders 302*a*, 302*b*. About half of the periphery of the spacers/springs 306 project into the air gap 308 so as to contact the conductive outer sheath 304 and prevent self activation of the sensor 300 due to sharp routing bends. The shape, quantity, position and stiffness of the spacers/springs 306 are selected to achieve a desired sensor activation force and travel.

The coaxial nature of sensor 300 enables a wide activation angle as will be appreciated more fully with additional reference to FIGS. 5A, 5B, and 5C which demonstrate how the sensor 300 reacts when a pinch force P is applied from top, left and right positions, respectively, and from which it should be appreciated that the sensor 300 has an activation angle of at least about two hundred and seventy degrees.

Figure 6A:
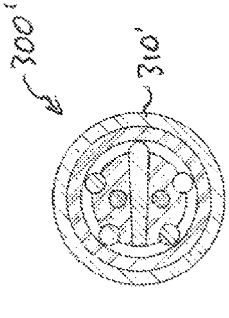
FIGS. 6A and 6B are cross-sectional views of variants of the pinch sensor shown in FIG. 5.
Figure 6B:
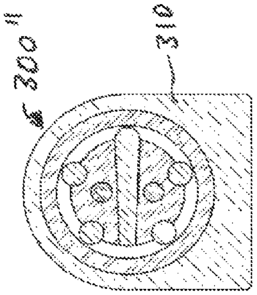

FIGS. 6A and 6B shown variants 300' and 300" of the coaxial pinch sensor which employ differently shaped casings 310' and 310".

Figure 7A:
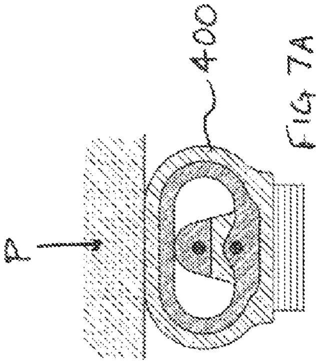
FIGS. 7A, 7B and 7C are cross-sectional views schematically demonstrating the deformation of the pinch sensor shown in FIG. 7 under loads directed from top, left and right directions, respectively.
Figure 7B:
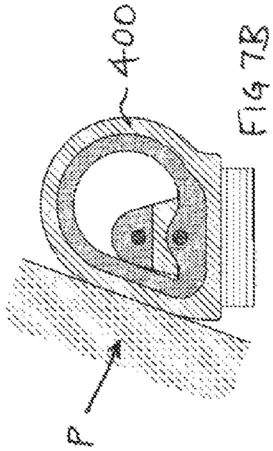
Figure 7C:
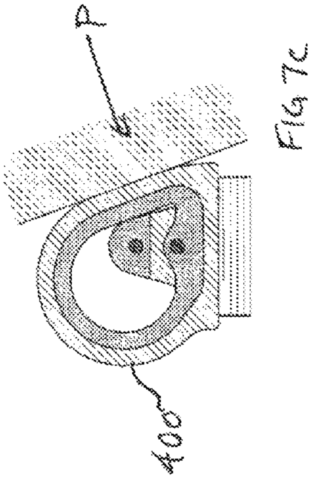
Figure 7:
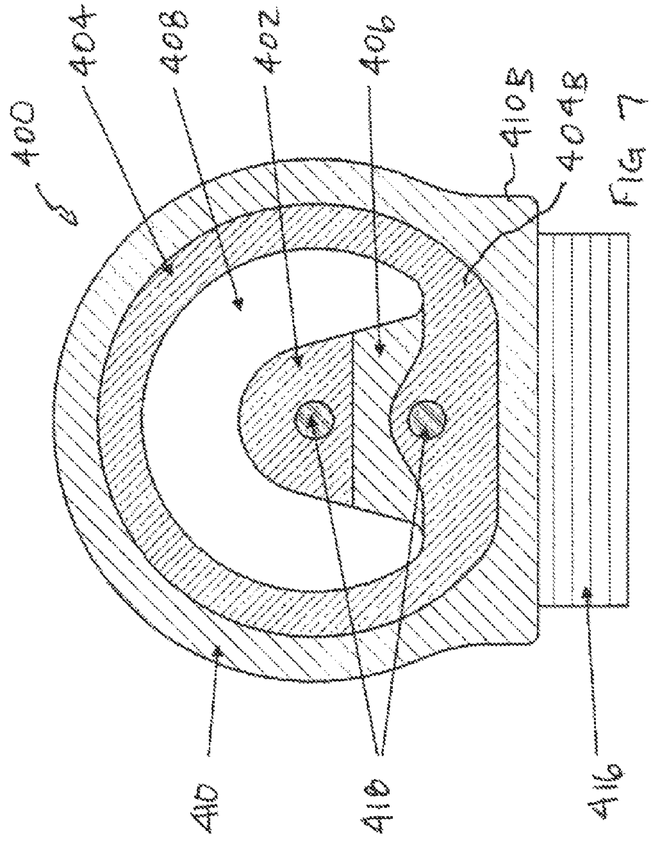
FIG. 7 is a cross-sectional view of a coaxial pinch sensor according to a third embodiment.

FIG. 7 shows an alternative embodiment of a coaxial pinch sensor 400 in cross-sectional view. The sensor 400 is also configured as an elongate bendable strip, and it will be understood that the cross-sectional profile shown in FIG. 7 is substantially constant along the length of the strip.

The coaxial pinch sensor 400 achieves a wide activation range or angle by incorporating a substantially electrically-conductive central core 402 and a substantially coaxial electrically-conductive tubular outer sheath 404 encapsulated by a nonconductive tubular casing 410. The conductive core 402 and conductive sheath 404 are normally spaced apart by an uvula-like base structure 406 projecting from the outer sheath 404, but upon application of a suitable pinch force to deform the casing 410 the conductive outer sheath 404, which is connected to one input of a controller (not shown), will come into contact with the conductive core 402, which is connected to another input of the controller, lowering the resistance therebetween and enabling the controller (not shown) to signal the presence of an obstacle.

More particularly, the coaxial pinch sensor 400 includes a resiliently deformable, non-conductive tubular casing 410, as may be provided by rubber, that forms the outer periphery of the sensor 400. The casing 410 encapsulates the conductive portions of the sensor, protecting it from ambient influences. The casing 410 also defines the stiffness of the section and its appearance. The particular casing 410 illustrated in FIG. 7 has three-quarter cylindrical shape including a flattened base section 410*b* to which an adhesive foam strip 416 can be applied to mount the sensor to a support surface.

The outer sheath 404 is disposed immediately adjacent an inner wall of the casing 410 and is also preferably shaped in the form of a three-quarter cylinder to matingly fit with the casing 410. The conductive core 402 is disposed within the outer sheath 404, being substantially coaxial therewith. The conductive core 402 also has a smaller diameter than the outer sheath 404 so as to leave an air gap 408 therebetween.

The conductive outer sheath 404 is preferably formed from an elastomeric material, such as conductive rubber. The outer sheath 404 includes a base portion 404*b* that envelops and surrounds a low resistance electrical conductor 418, such as discussed above, that is connected to a controller input.

The uvulate base structure 406 is a nonconductive platform disposed atop the base portion 404*b*). The conductive core 402, which is preferably formed from an elastomeric conductive material such as conductive rubber is disposed atop the base structure 406 and envelops a low resistance electrical conductor 418, such as discussed above, that is connected to a controller input. The base structure 406 maintains a minimum spacing between the electrical conductors 418 embedded in the core 402 and sheath 404 and prevents the collapse of the section under sharp bends in the coaxial strip sensor 400.

In the illustrated embodiment the conductive core 402 has a substantially three-quarter circle cross-sectional profile. The air gap 408 is preferably crescent or sector shaped in section over an angular range of about two hundred and seventy degrees. The crescent or sector shape of the air gap 408, coupled with the three-quarter circular shape of the conductive core, provides a relatively uniform depth d across the air gap 408 and thus a relatively constant activation travel over a wide range of pinch directions. This will be appreciated more fully with additional reference to FIGS. 7A, 7B, and 7C which demonstrate how the sensor 400 reacts when a pinch force P is applied from top, left and right positions, respectively, and from which it should be appreciated that the sensor 400 has an activation angle of at least about two hundred and seventy degrees.

Figure 8A:
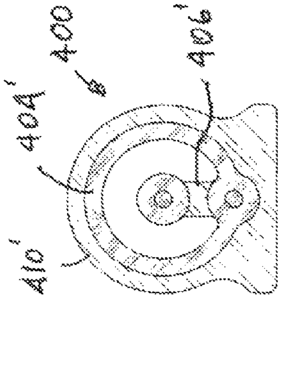
FIGS. 8A and 8B are cross-sectional views of variants of the pinch sensor shown in FIG. 7.
Figure 8B:
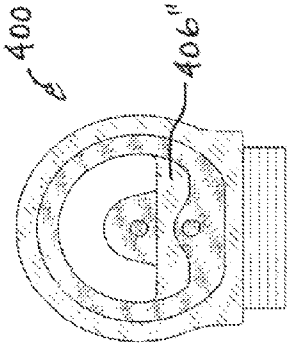

FIG. 8A shows a variant 400' of the coaxial pinch sensor which employs a more cylindrical casing 410' and outer sheath 404', along with a narrower uvulate base structure 406', thereby enabling an even wider range of activation angles. FIG. 8B shows a variant 400" of the coaxial pinch sensor which employs a broader uvulate base structure 406", resulting in a more limited range of activation angles.

While the above describes a particular embodiment(s) of the invention, it will be appreciated that modifications and variations may be made to the detailed embodiment(s) described herein without departing from the spirit of the invention.

The invention claimed is:

1. A pinch sensor (100, 100', 200, 200'), comprising:

a non-conductive tubular casing (110; 210) having an outer wall and an inner wall and defining an internal hollow region (108; 208), the tubular casing being formed from a resiliently deformable material;

three electrically-conductive conduits (102; 202, 203) disposed along the casing inner wall, wherein each electrically-conductive conduit has a periphery that extends into the hollow region, and wherein, in section, the three electrically-conductive conduits are substantially equidistantly spaced circumferentially along the casing inner wall;

wherein, upon deformation of the casing, at least one of the electrically-conductive conduits (102; 202) comes into contact with a electrically conductive reference element (112; 203) to thereby lower the resistance therebetween.

2. A pinch sensor (100, 100', 200, 200') according to claim 1, wherein each electrically-conductive conduit comprises an elastomeric electrically conductive skirt (104; 204) enveloping a low resistance electrical conductor (106; 206).

3. A pinch sensor (200) according to claim 2, wherein:

the casing has a cross-sectional shape of a semi-circular arch (210) having a base portion (210*b*) and a semi-circular portion (210*a*);

one of the electrically-conductive conduits (203) is disposed along the base portion and functions as said reference element;

two of the electrically-conductive conduits (202) are disposed along the semi-circular portion; and the internal hollow region (208) includes two rebates (208*a*, 208*b*) straddling the electrically-conductive reference conduit (203), each rebate presenting a pivot point enabling the casing to flex such that the corresponding electrically-conductive conduit (202) disposed along the semi-circular portion is directed towards the electrically-conductive reference conduit.

4. A pinch sensor (100, 100') according to claim 1, including an electrically-conductive core (112) functioning as said reference element, the electrically-conductive core (112) being disposed within the casing inward of the three electrically-conductive conduits (102) and being connected to casing by one or more non-conductive webs (111) branching from the casing inner wall.

5. A pinch sensor (100, 100') according to claim 4, wherein the electrically-conductive core (112) has a tri-petal cross-sectional shape so as to trisect the internal hollow region into three air gaps (108*a*, 108*b*, 108*c*), and wherein each of the electrically-conductive conduits (102*a*, 102*b*, 102*c*) projects partially into one of the three individual air gaps, respectively.

6. A pinch sensor (100, 100') according to claim 5, wherein each electrically-conductive conduit (102) comprises an elastomeric electrically conductive skirt (104) enveloping a low resistance electrical conductor (106).

7. A pinch sensor (100, 100') according to claim 6, wherein the conductive skirts (104*a*, 104*b*, 104*c*) have substantially similar circular cross-sectional profiles and the air gaps (108*a*, 108*b*, 108*c*) have substantially similar sector-shaped cross-sectional profiles of substantially uniform depth, thereby providing a substantially uniform travel for activating the sensor across an activation angle of at least 270 degrees.

8. A pinch sensor (100, 100') according to claim 5, wherein the electrically-conductive core (112) comprises an elastomeric electrically conductive skirt (113) enveloping a low resistance electrical conductor (114).

9. A pinch sensor (100) according to claim 8, wherein the casing has a cross-sectional shape of a three-quarter cylinder.

10. A pinch sensor (300, 300', 300"; 400, 400', 400"), comprising:

a non-conductive tubular casing (310; 410) formed from a resiliently deformable material;

a electrically-conductive tubular conduit (304; 404) disposed within the tubular casing, the tubular conduit having an inner wall defining an internal hollow region (308; 408); and an electrically-conductive core (302; 402) disposed within the electrically-conductive tubular conduit and normally spaced apart therefrom;

wherein, upon deformation of the casing, the electrically-conductive tubular conduit comes into contact with the electrically-conductive core to thereby lower the resistance therebetween.

11. A pinch sensor (300, 300', 300"; 400, 400', 400") according to claim 10, including at least one non-conductive spacing element (306; 406, 406', 406") disposed between the electrically-conductive core and the electrically-conductive tubular conduit.

12. A pinch sensor (300, 300', 300"; 400, 400', 400") according to claim 11, wherein the electrically-conductive core is substantively coaxial with the electrically-conductive tubular conduit.

13. A pinch sensor (300, 300', 300") according to claim 12, including multiple non-conductive spacing elements (306) disposed between the electrically-conductive core and the electrically-conductive tubular conduit, and wherein the spacing elements are resiliently compressible.

14. A pinch sensor (300, 300', 300") according to claim 13, wherein the electrically-conductive core is segmented by a nonconductive divider (308) having an end portion contacting the electrically-conductive tubular conduit.

15. A pinch sensor (300, 300', 300") according to claim 14, wherein the electrically-conductive core comprises an elastomeric electrically conductive skirt enveloping a low resistance electrical conductor.

16. A pinch sensor (400) according to claim 11, wherein:

the electrically-conductive tubular conduit has a cross-sectional shape of a three-quarter cylinder having a base portion and a semi-circular portion;

the spacer is connected to the base portion of the electrically-conductive tubular conduit;

the electrically-conductive core has a semi-circular cross-sectional shape;

the hollow region includes an air gap that has a substantially sector-shaped cross-sectional profile of substantially uniform depth, thereby providing a substantially uniform travel for activating the sensor across an activation angle of at least 270 degrees.

* * * * *